United States Patent
Bastiaansen et al.

(10) Patent No.: US 6,766,152 B2
(45) Date of Patent: Jul. 20, 2004

(54) SIGNAL TREATING CIRCUIT WITH A CLASS A/B OUTPUT STAGE CONNECTABLE TO A SOURCE OF MULTIPLE SUPPLY VOLTAGES

(75) Inventors: Cornelis Anthonius Adrianus Bastiaansen, Eindhoven (NL); Eise Carel Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 574 days.

(21) Appl. No.: 09/790,456

(22) Filed: Feb. 22, 2001

(65) Prior Publication Data

US 2001/0026564 A1 Oct. 4, 2001

(30) Foreign Application Priority Data

Feb. 24, 2000 (EP) ............................................. 00200637

(51) Int. Cl.[7] ................................................ H04B 1/04
(52) U.S. Cl. ................................ 455/127.2; 455/127.1; 455/125; 455/341
(58) Field of Search ............................ 455/127.2, 126, 455/127.3, 69, 91, 127.1, 125, 341; 330/84, 146, 297, 273, 97, 207 R, 250

(56) References Cited

U.S. PATENT DOCUMENTS

| | | | | | |
|---|---|---|---|---|---|
| 4,721,919 A | * | 1/1988 | LaRosa et al. | ............... | 330/146 |
| 5,300,893 A | * | 4/1994 | Freuler et al. | ................. | 330/84 |
| 5,402,084 A | * | 3/1995 | Freuler et al. | ............... | 330/146 |
| 5,903,189 A | * | 5/1999 | Huijser | ....................... | 330/146 |

* cited by examiner

*Primary Examiner*—Sonny Trinh
(74) *Attorney, Agent, or Firm*—Aaron Waxler

(57) ABSTRACT

An A/B class output stage of a signal treating circuit, such as for example a mobile telephone, a radio car kit, other portable equipment, etc. treats a signal. The A/B class output stage drives a load with the signal as treated by the signal treating circuit. The output stage can be connected to one of more than one supply voltages as a function of a voltage value of the signal. The signal treating circuit comprises a D/A converter circuit and a non-linear operating circuit between an input of the signal treating circuit and the D/A converter. Above a certain signal value a change in supply voltage is made. Distortions in an output signal resulting from such a change are prevented by having the non-linear operating circuit generate a jump in DC level at an output of the output stage or raise a value of the signal at a non-clipping one of two output terminals with an extra amount that compensates for the clipping at a clipping one of the two output terminals.

8 Claims, 2 Drawing Sheets

SIGNAL TREATING CIRCUIT WITH A CLASS A/B OUTPUT STAGE CONNECTABLE TO A SOURCE OF MULTIPLE SUPPLY VOLTAGES

The invention relates to a signal treating circuit with a class A/B output stage connectable to a source of multiple supply voltages, with means for connecting the output stage again and again to a one of said multiple supply voltages as a function of a voltage value of a signal treated by the signal treating circuit.

A signal treating circuit to which the invention relates may be for example a driver for telephones. The output stage of a driver for telephones operates mostly in class-A/B mode with a small bias current of about 100 uA and is capable to deliver currents of 20 mA or more to the speaker. The audio signal to be delivered is on average at a level of about 10% of full output level. The output stage operates in a balanced (bridge) driver configuration.

The value of the supply voltage is determined by the maximum voltage swing of a load. As a consequence at low signal levels the voltage across the output transistors is much larger than the voltage across the load. Consequently power dissipated in the output stage is about four times larger than the power delivered to the load.

It is an object of the present invention to provide a method and a signal treating circuit that operates more efficiently with the power supplied by a power supply to the signal treating circuit and the output stage.

A signal treating circuit according to the invention thereto is characterized in that the function is a function of a first instantaneous voltage value of the signal as treated by the signal treating circuit.

Thereby it is achieved that actually when a larger signal is present the switch is made to a higher voltage as a supply voltage for the output stage. This is in contrast to methods and circuits in which an average level of the signal over a certain larger period of time is taken as a measurement of the presence and absence of smaller and larger output signals.

In a situation that more than one supply voltage is available the output stage can operate on a lower supply voltage, for example 0.9 V, for small output signals and switch over to a higher voltage, for example 2 V, for larger signals. Also the standby current, i.e. the current through the output stage of a class-A/B mode output stage is in such a situation delivered by the lowest supply voltage. A DC operating level at the output of a class-A/B mode output stage in the above example is then 0.45 V for small output signals and 1 V for larger output signals.

The signal, a voltage value of which is used to determine to which supply voltage the output stage will be connected may be the signal at an input of the signal treating circuit, the signal somewhere in the signal treating circuit between an input and the output stage or it may be the signal as treated by the signal treating circuit at the output stage.

A preferred embodiment of a signal treating circuit according to the invention is characterized by means for generating at least one reference voltage value, a memory for storing voltage values and by means for storing at least a second instantaneous voltage value of the signal in the memory when the first instantaneous voltage value of the signal crosses one of said at least one reference voltage values.

Thereby it is achieved that voltage values of the signal can be easily compared to the stored values. This is of particular advantage when the voltage value of the signal is present in digital form and the stored voltage value of the signal also is available in digital form. In such a case a simple digital comparison can be made to determine whether or not an actual value of the voltage value of the signal is above or below a stored voltage value of the signal.

It is to be noted that the invention is independent of the type of signal, analog or digital.

A still further preferred embodiment of the invention is characterized in that the signal treating circuit comprises a D/A converter and a non-linear operating circuit between an input of the signal treating circuit and the D/A converter, in that in operation the non-linear operating circuit generates a jump in DC level at an output of the output stage and in that means are present for at the same point of time making jumps in DC level at the output of the output stage and making changes in supply voltage for the output stage.

A still further preferred embodiment of a signal treating circuit according to the invention in which the output stage comprises first and second output terminals and the first and second output terminals are provided with the signal as treated in opposite phases is characterized by means for raising the signal as treated at the first output terminal when the signal as treated at the second output terminal clips and vice versa and by means for raising during clipping the voltage value of the signal as treated that does not clip with an extra amount that compensates for the clipping of the signal as treated that clips.

The invention will now further be described in more detail with reference to the attached drawings, in which.

Figure 1:
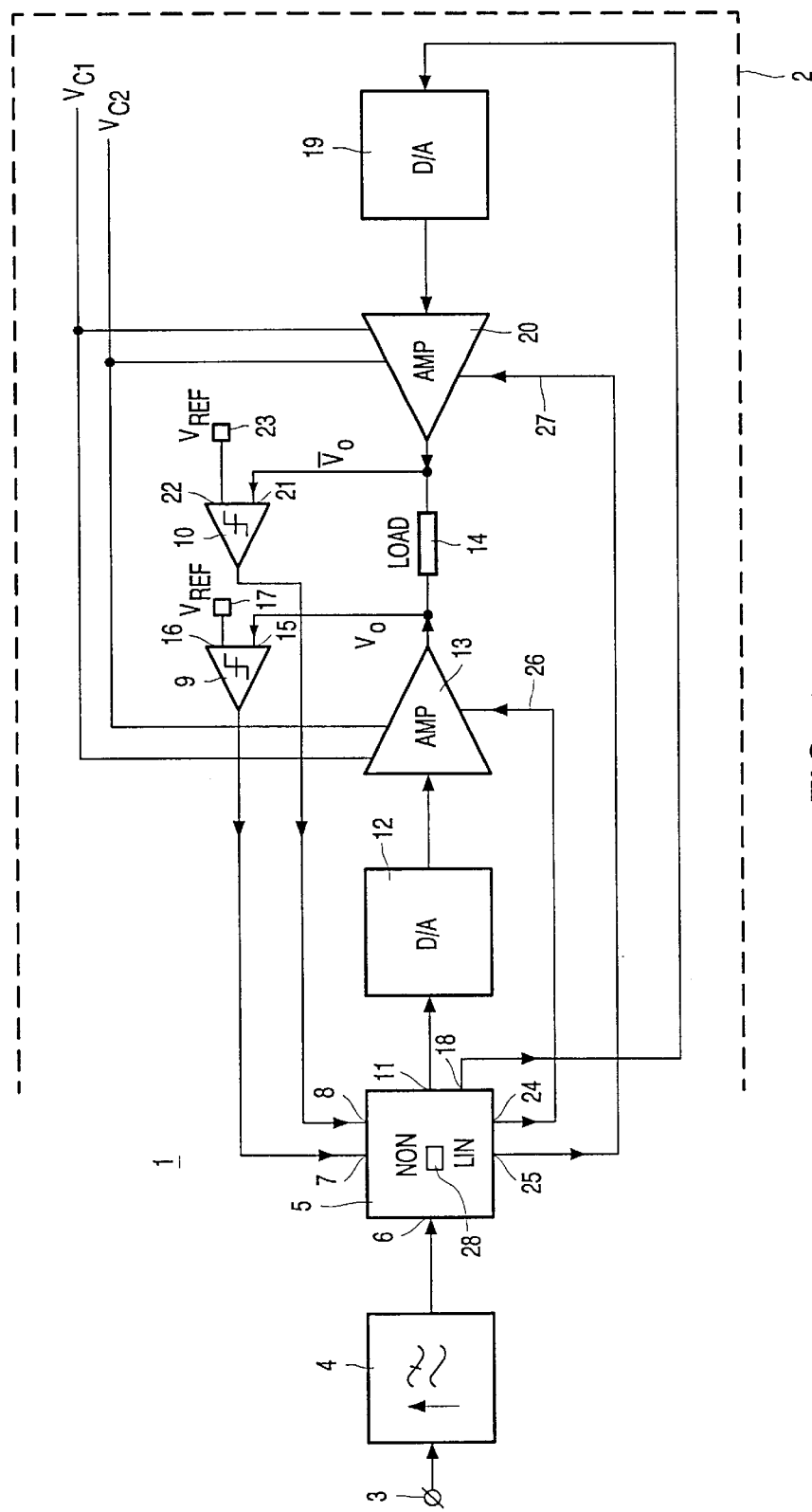
FIG. 1 shows a signal treating circuit according to the invention.
Figure 2:
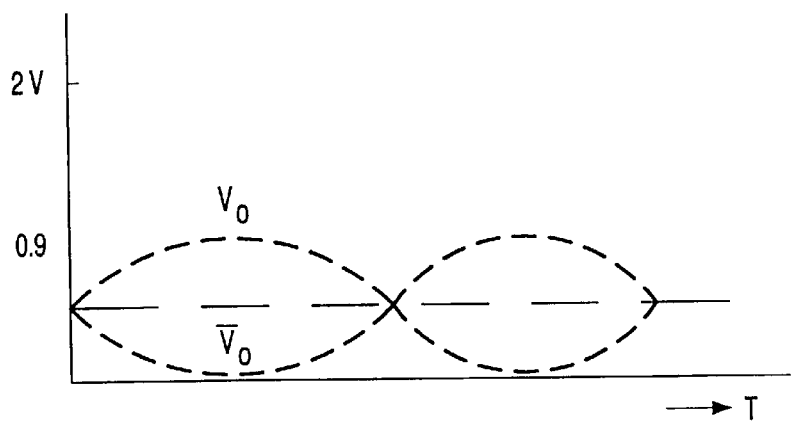
FIG. 2 shows output voltage values across the load for small signals.

FIG. 1 shows a. signal treating circuit 1 in a housing schematically shown at 2 of a e.g. mobile telephone. The signal treating circuit 1 comprises an input 3 to which is connected an input stage 4. An output of the input stage 4 is connected to a non-linear operation circuit 5 with a first input 6 for receiving the signal to be treated from the circuit 4. The non-linear operation circuit 5 comprises a second input 7 and a third input 8 for receiving signals from first comparator circuit 9 and second comparator circuit 10. A first output 11 of the non-linear operation circuit is connected to an input of a first D/A conversion circuit 12. An output of the first D/A conversion circuit 12 is connected to an input of a first adjustable amplifier 13. An output of first adjustable amplifier 13 is connected to a first side of a load 14 and to a first input 15 of the first comparator circuit 9. A second input 16 of the first comparator 9 is connected to a first reference voltage source 17. A second output 18 of the non-linear operation circuit 5 is connected to an input of a second D/A conversion circuit 19. An output of second D/A conversion circuit 19 is connected to an input of a second adjustable amplifier 20. An output of second adjustable amplifier 20 is connected to a second side of load 14 and to a first input 21 of the second comparator circuit 10. A second input 22 of the second comparator 10 is connected to a second reference voltage source 23. A third output 24 and a fourth output 25 of the non-linear operation circuit 5 are connected to the first adjustable amplifier 13 and to the second adjustable amplifier 20 via lines 26 and 27, respectively. First adjustable amplifier 13 and second adjustable amplifier 20 are both selectively connectable to supply voltages Vc1 and Vc2.

First adjustable amplifier 13 and second adjustable amplifier 20 together form an output stage of e.g. a driver for a mobile telephone and operates in class-A/B mode with a small bias current of about 100 μA and are capable to deliver currents of 20 mA or more to the output load 14, which in case of a mobile telephone may for example be a speaker. Vc1 is a low supply voltage of e.g. 0.9 V. Vc2 is a high supply voltage of e.g. 2 V. At any point of time both the first and the second adjustable amplifiers 13 and 20 respectively are connected either to supply voltage Vc1 or to supply voltage Vc2. Switching over from supply voltage Vc1 to supply voltage Vc2 or back from supply voltage Vc2 to supply voltage Vc1 takes place under control of signals generated by the non-linear operation circuit 5 at the outputs 24 and 25 respectively.

The operation of circuit 1 will now be described for small output signals. Small output signals across load 14 means also small input signals at the input 3. In the standby situation in which there is no signal present at input 3 first and second adjustable amplifiers 13 and 20 respectively both are connected to supply voltage Vc1. In the standby situation both outputs of adjustable amplifiers 13 and 20 are at a voltage level which is half of Vc1. The reference voltage sources 17 and 23 supply reference voltages which are substantially equal to Vc1. Since the voltage values at inputs 14 and 21 of comparator circuits 9 and 10 respectively are below the voltage values at inputs 16 and 22 of comparator circuits 9 and 10 respectively the outputs of both comparator circuits 9 and 10 are low. Low input signals at inputs 7 and 8 of non-linear operation circuit 5 lead to signals at outputs 24 and 25 which make adjustable amplifiers 13 and 20 to be connected to supply voltage Vc1.

For small signals, i.e. a small signal at input 3 leading to a small signal at the outputs of adjustable amplifiers 13 and 20 respectively leads to small signals across load 14. Such small signals are defined by not driving the voltage across load 14 over Vc1, e.g. 0.9 V.

For larger signals the situation is different. Larger signals are defined by driving the output of adjustable amplifier 13 and 20 to voltage values above Vc1 or 0.9 V. In that situation and without farther measures being taken the low going portions of the signals at the outputs are clipped by the zero level. As a consequence the signal across the load 14 is distorted.

Figure 3:
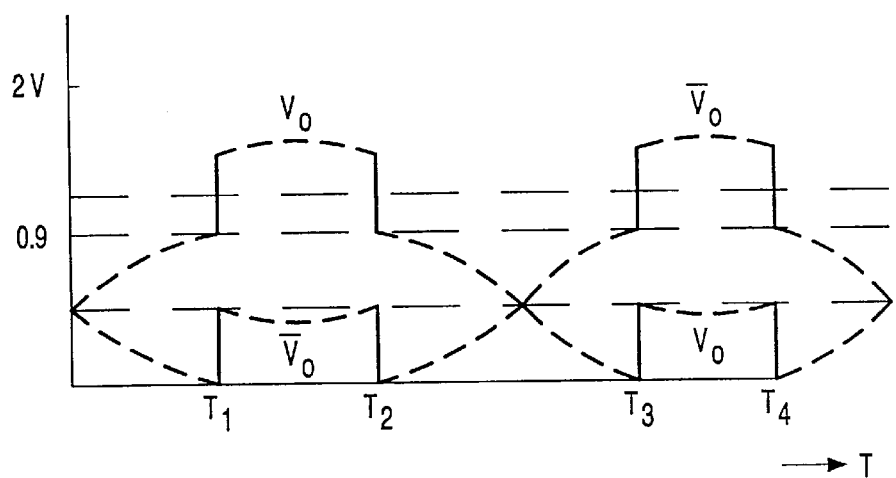
FIG. 3 shows output voltage signals across the load for larger signals with a jump in DC level.

In a first solution according to the invention the adjustable amplifiers 13 and 20 are connected to voltage supply Vc2 and the DC level at the outputs of the adjustable amplifiers 13 and 20 is increased to half Vc2 or 1 V. This is shown in FIG. 3. As long as the output levels at the outputs of adjustable amplifier 13 and adjustable amplifier 20 have not yet reached half Vc1 and 0 V respectively no changes take place in the circuit as described hereinabove with respect to the standby and small signal situations. However as soon as the output voltage value V0 at the output of adjustable amplifier 13 and the output voltage value V0 at the output of adjustable amplifier 20 reach Vc1 and 0 V respectively, which happens at the some point of time, the comparator 9 becomes active and changes its output from a logical 0 to a logical 1 level. As a consequence of the logical 1 level at the input 7 of the non-linear operation circuit 5 both outputs 24 and 25 change state. Due to the change of state at the lines 26 and 27 adjustable amplifiers 13 and 20 will be connected to supply voltage Vc2. Also as a consequence of the logical 1 level at the input 7 of non-linear operation circuit 5 the digital signal representing the signal to be treated will appear at outputs 11 and 18 of non-linear operation circuit 5 representing a DC operating level at the outputs of adjustable amplifiers 13 and 20 of half Vc2 or 1 V. As a consequence a jump is made in the DC operating level at the outputs of adjustable amplifiers 13 and 20 from half Vc1 to half Vc2. As a consequence there is now room for the voltage values V0 and $\overline{V0}$ V0 to grow up to 2 V and go down to 0 V respectively again but now centered on the DC level of half Vc2 or 1 V. Concurrent with the generation of the signals at outputs 24 and 25 and also in response to the appearance of a logical 1 level at input 7 an absolute value of the signal present at input 6 of non-linear operation circuit 5 has been stored in memory 28 of non-linear operation circuit 5. As from point of time T1 forward comparators 9 and 10 are inoperative for changing states at outputs 24 and 25 and on lines 26 and 27. As from T1 onwards a comparison takes place between the voltage value stored in memory 28 and the voltage value of the signal present at input 6 of the non-linear operation circuit 5.

At point of time T2 the voltage value at the output of adjustable amplifier 20 is increasing again and reaches the same voltage value at which at point of time T1 the change was made from connecting adjustable amplifiers 13 and 20 to supply voltage Vc1 to connecting adjustable amplifiers 13 and 20 to supply voltage Vc2. That means that in non-linear operation circuit 5 the absolute value of the signal present at input 6 of the non-linear operation circuit 5 again equals and passes the voltage values stored in memory 28. As a consequence at point of time T2 signals are generated at the outputs 24 and 25 of non-linear operation circuit 5 and on lines 26 and 27 which have as a consequence that the adjustable amplifiers 13 and 20 are connected back to supply voltage Vc1. Another consequence is that at the outputs 11 and 18 of the non-linear operation circuit 5 the signals will be such that the DC operating levels at the outputs of the adjustable amplifiers 13 and 20 is back to half Vc1 or 0.45 V again. That situation continues after T2. The (AC) signal that is to be treated by the signal treating circuit 1 continues and at the point of time T3 the voltage value V0 at the output of adjustable amplifier 13 reaches 0 and at the same time the voltage value $\overline{V0}$ at the output of adjustable amplifier 20 reaches Vc1 or 0.9 volt. Concurrently therewith the voltage value of the signal at the input 6 of nonlinear operating circuit 5 again reaches and passes the value stored in memory 28. Again the states at the outputs 24 and 25 and on the lines 26 and 27 change, so that the adjustable amplifiers 13 and 20 again are connected to supply voltage Vc2 at a point of time T3. Also the voltage values represented by the signals at outputs 11 and 18 are changed such that again, just as at the point of time T1, the DC operating level at the outputs of adjustable amplifiers 14 and 20 is raised to half Vc2 or 1 volt. It is now the voltage value V0 at the output of adjustable amplifier 20 that may continue to rise up to Vc2 or 2 volts and it is now voltage value $\overline{V0}$ at the output of adjustable amplifier 14 that may go down to 0 volt. At the point of time T4 the voltage value of the signal at input 6 of non-linear operating circuit 5 again reaches and passes the voltage value stored in a memory 28 and change of states takes place at outputs 24 and 25 of non-linear operating circuit 5 and on lines 26 and 27. As a consequence adjustable amplifiers 13 and 20 are connected back to supply voltage Vc1 again. Also at the same point of time T4 the voltage values represented by the signal at the output 11 and 18 are adjusted such that the DC operating level at the outputs of the adjustable amplifiers 13 and 20 is back to half or 0.45 volts again.

In the above description the switching by the adjustable amplifiers 13 and 20 from supply voltage Vc1 to supply voltage Vc2 was originally initiated by the voltage value V0 at the output of adjustable amplifier 13 reaching Vc1 or 0.9 volt. That was coincidental in a sense that it is not predefined which of the two outputs, i.e. the output of adjustable amplifier 13 and the output of adjustable amplifier 20, will be the first one to reach Vc1.

As described herein above the jump in DC operating level has to be delivered by the D/A converters 12 and 19 that drive the adjustable amplifiers 13 and 20 respectively. To achieve this a known non-linear operation has to be applied to the signals to be treated before entering the D/A converters 12 and 19. It has further been assumed that the gains of both adjustable amplifiers 13 and 20 are perfectly equal. In that case the voltage jumps at a points of time T1, T2, T3, and T4 will be perfectly equal and a voltage across load 14 will not be affected by those voltage jumps. However, when the gains of the adjustable amplifiers 13 and 20 are not perfectly equal those voltage jumps will not be exactly equal and a click may result in the load 14.

Figure 4:
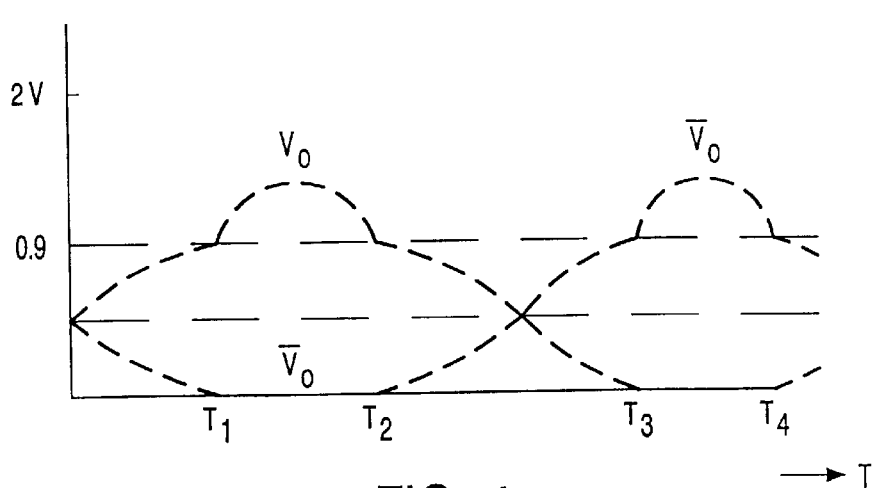
FIG. 4 shows output voltage values across the load for larger signals without a jump in DC level.

A solution to that problem will be described with reference to FIG. 4. In FIG. 4 the points of time T1, T2, T3 and T4 have been indicated and correspond to the points of time indicated with the same letters and numerals in FIG. 3. Regarding FIG. 4 the operation of the non-linear operating circuit 5 is slightly different from the operation of the non-linear operating circuit 5 as described in relation to FIG. 3. As described hereinbefore the voltage value of the signal present at input 6 of the non-linear operating circuit 5 at the point of time that for the first time either a voltage value V0 or a voltage value $\overline{V0}$ reaches Vc1, comparator 9 or comparator 10 sends a signal to input 7 or input 8, respectively of non-linear operating circuit 5 whereby the voltage value of the signal present at the input 6 of non-linear operating circuit 5 is stored in memory 28. As hereinbefore it is assumed that said first time takes place at point of time T1.

For the sake of simplicity it is assumed that there will be no difference in treatment between the outputs 11 and 18 of the non-linear operating circuit 5. At point of time T1 the output value V0 of adjustable amplifier 20 reaches 0. In order that the voltage across the load 14 keeps on increasing as if nothing would have happened the voltage value V0 at any point of time between T1 and T2 must be raised with a voltage value that is equal to the voltage value that in case no interruption had taken place voltage value $\overline{V0}$ at the output of adjustable amplifier 20 would have had below the 0 line in FIG. 4.

The raising of voltage value V0 is accomplished as follows between T1 and T2. At point of time T1 signals appear at the outputs 24 and 25 of non-linear operating circuit 5 for transport over lines 26 and 27, respectively to adjustable amplifiers 13 and 20, respectively for the adjustable amplifiers 13 and 20 to switch over from supply voltage Vc1 to supply voltage Vc2. In non-linear operating circuit 5 the voltage value as stored in memory 28 is subtracted from an absolute value of the voltage value of the signal present at the input 6 of non-linear operating circuit 5. That difference represents a fictive voltage value of $\overline{V0}$ below 0 at any point of time between T1 and T2. Said difference is established various times and at various points of time between T1 and T2. At any point of time between T1 and T2 that said difference is established said difference is added to the voltage value of the signal present at input 6 of the non-linear operating circuit 5. After the addition the signal with the added part is presented to the outputs 11 and 18 of the non-linear operating circuit 5 for further treatment by the D/A converters 12 and 19. Since the output of adjustable amplifier 20 has already reached 0 volt at the point of time T1 the addition of said difference to the signal presented at output 18 of non-linear operating circuit 5 does have no effect at all: the voltage value $\overline{V0}$ at the output of adjustable amplifier 20 is 0 and remains 0. Therefore it is not necessary to make the addition to the signals in the non-linear operation circuit 5 to be presented at output 18. But it provides for simpler circuitry. However, the voltage value V0 at the output of adjustable amplifier 13 is raised with exactly the amount that is necessary to compensate for the loss of signal at the output of adjustable amplifier 20.

At the point of time T2 the addition reaches 0 again and signals appearing at outputs 24 and 25 of the non-linear operating circuit 5 and on lines 26 and 27 cause adjustable amplifiers 13 and 20 to switch back to supply voltage Vc1.

Between points of time T2 and T3 no changes take place and the situation remains as it was established at the point of time T2. Non-linear operating circuit 5 in establishing the difference between an absolute value of the voltage value of the signal present at input 6 and the value stored in memory 28 notices that said difference is negative between points of time T2 and T3. During such periods of time in which that difference is negative the voltage values of the signal present at input 6 are presented unchanged at the outputs 11 and 18 of the non-linear operating circuit 5. Between points of time T3 and T4 the difference is positive again and the difference is added to the voltage values of the signal present at input 6 to appear with the raised values at outputs 11 and 18. Since now the voltage value V0 at the output of adjustable amplifier 13 has reached 0 any increase in voltage value at output 11 of non-linear operating circuit 5 is ineffective, but the increase in voltage value of the signal present at output 18 is effective and through D/A converter 19 and adjustable amplifier 20 the voltage value $\overline{V0}$ at the output of adjustable amplifier 20 is raised with just the right amount.

In the above description it has been assumed that the operations in the non-linear operating circuit 5 are digital operations. In particular the determination of the difference signals and the adding thereof to the signals are described as being digital operations. However that is not necessary. It is also possible to determine the differences with an monitoring circuit including an analog amplifier and an addition circuit for adding the difference signals to the inputs of the adjustable amplifiers 13 and 20. However this requires extra analog circuitry with power dissipation which is considered a disadvantage relative to the digital solution described hereinabove.

The above described invention has been described relative to an output stage in class A/B mode in a mobile telephone. However, the invention is not restricted to such use. Other equipment in which the invention can be embodied are any type of portable equipment, digital car radio, etc.

What is claimed is:

1. Signal treating circuit with a class A/B output stage (13, 14, 20) connectable to a source of multiple supply voltage (Vc1, Vc2) with means (5, 24, 25, 26, 27) for connecting the output stage (13, 14, 20) again and again to a one of said multiple supply voltages (Vc1, Vc2) as a function of a voltage value of a signal treated by the signal treating circuit, wherein the function is a function of a first instantaneous voltage value of the signal as treated by the signal treating circuit and wherein means (17, 23) for generating at least one reference voltage value (Vref), a memory (28) for storing voltage values and by means for storing at least a second instantaneous voltage value of the signal in the memory (28) when the first instantaneous voltage value of the signal crosses one of said at least one reference voltage values (Vref).

2. Signal treating circuit according to claim 1 characterized in that the second instantaneous voltage value is an instantaneous voltage value of the signal present at an input (3) of the signal treating circuit.

3. Signal treating circuit according to claim 2, characterized by means for connecting the output stage (13, 14, 20) to a higher (Vc2) and a lower (Vc1) supply voltage, respectively each time an instantaneous voltage value of the signal crosses a stored second instantaneous voltage value in one and the other direction, respectively.

4. Signal treating circuit according to claim 1, characterized by a digital memory (28) for storing the to be stored second instantaneous voltage values of the signal.

5. Signal treating circuit with a class A/B output stage (13, 14, 20) connectable to a source of multiple supply voltage (Vc1, Vc2) with means (5, 24, 25, 26, 27) for connecting the output stage (13, 14, 20) again and again to a one of said multiple supply voltages (Vc1, Vc2) as a function of a voltage value of a signal treated by the signal treating circuit, wherein the function is a function of a first instantaneous voltage value of the signal as treated by the signal treating circuit, and wherein the signal treating circuit comprises a D/A converter (12, 19) and a non-linear operating circuit (5) between an input (3) of the signal treating circuit and the D/A converter (12, 19), in that in operation the non-linear operating circuit(s) generates a jump in DC level at an output of the output stage (13, 14, 20) and in that means (5) are present for at the same point of time making jumps in DC level at the output of the output stage (13, 14, 20) and making changes in supply voltage (Vc1, Vc2) for the output stage (13, 14, 20).

6. Signal treating circuit according to claim 5 in which the output stage (13, 14, 20) comprises first and second output terminals and in which when in operation the first and second output terminals are provided with the signal as treated in opposite phases characterized by means for raising the signal as treated at the first output terminal when the signal as treated at the second output terminal clips and vice versa and by means for raising during clipping the voltage value of the signal as treated that does not clip with an extra amount that compensates for the clipping of the signal as treated that clips.

7. Signal treating circuit according to claim 6 characterized by an input (31) for receiving digital signals to be treated, which input (3) is connected to the non-linear operating circuit (5), which non-linear operating circuit (5) in response to a signal indicating clipping applies a compensation signal to the signal to be treated before entering the D/A converter (12).

8. Signal treating circuit with an output stage (13, 14, 20) and connectable to a supply voltage source (Vc1, Vc2), which circuit in operation treats a signal characterized by more than one supply voltages (Vc1, Vc2), the output stage (13, 14, 20) comprising a first (13) and a second (20) adjustable amplifier, an input (3) for receiving a signal to be treated in digital form, a non-linear operation circuit (5) with a first input (6) for receiving the signal to be treated from the input (3) of the signal treating circuit, and with second (7) and a third (8) inputs receiving signals from first (9) and a second (10) comparator circuits, a first output (11) of the non-linear operation circuit (5) being connected to an input of a first D/A conversion circuit (12), an output whereof is connected to an input of the first adjustable amplifier (13), an output whereof is connected to a first side of a load (14) and to a first input (15) of the first comparator circuit (9), the second input (16) of the first comparator circuit (9) being connected to a first reference voltage source (17), a second output (18) of the non-linear operation circuit (5) being connected to an input of a second D/A conversion circuit (19), an output whereof is connected to an input of the second adjustable amplifier (20), an output whereof is connected to a second side of a load (14) and to a first input (21) of the second comparator circuit (10), the second input (22) of the second comparator circuit (10) being connected to a second reference voltage source (23), a third (24) and a fourth (25) output of the non-linear operation circuit (5) being connected to the adjustable first (13) and second (20) amplifier, respectively for adjustably connecting the first (13) and second (20) amplifier to one of the more than one supply voltages (Vc1, Vc2).

* * * * *